United States Patent
Hales et al.

(10) Patent No.: US 7,476,840 B2
(45) Date of Patent: Jan. 13, 2009

(54) SENSING LIGHT AND SENSING THE STATE OF A MEMORY CELL AN AID OF A SWITCH CONTROLLED BY A SCHMIDT TRIGGER

(75) Inventors: Rex K. Hales, Riverton, UT (US); Tracy Johancsik, Murray, UT (US); Thomas L. Wolf, Salt Lake City, UT (US)

(73) Assignee: SliceX, Inc., Draper, UT (US)

( * ) Notice: Subject to any disclaimer, the term of this patent is extended or adjusted under 35 U.S.C. 154(b) by 0 days.

(21) Appl. No.: 11/745,929

(22) Filed: May 8, 2007

(65) Prior Publication Data

US 2007/0262803 A1 Nov. 15, 2007

Related U.S. Application Data

(60) Provisional application No. 60/809,703, filed on May 30, 2006, provisional application No. 60/798,860, filed on May 8, 2006.

(51) Int. Cl.
*H01J 40/14* (2006.01)
(52) U.S. Cl. .............................. 250/214 R; 250/214 LS
(58) Field of Classification Search ............. 250/214 R, 250/214 LS, 214 SW, 214.1, 208.1; 327/206, 327/409, 514, 517; 348/143, 220.1, 584; 361/232, 87, 115
See application file for complete search history.

(56) References Cited

U.S. PATENT DOCUMENTS

| | | | |
|---|---|---|---|
| 4,249,109 A | 2/1981 | Ogawa | |
| 4,468,562 A | 8/1984 | Wicnienski et al. | |
| 5,663,556 A | * 9/1997 | Wessels et al. | ........... 250/214.1 |
| 6,084,456 A | 7/2000 | Seol | |
| 6,117,643 A | 9/2000 | Simpson et al. | |
| 6,414,746 B1 | 7/2002 | Stettner et al. | |
| 7,186,968 B2 | 3/2007 | Raynor | |
| 2003/0112680 A1 | 6/2003 | Nirschl | |
| 2004/0002644 A1 | 1/2004 | Seim et al. | |

FOREIGN PATENT DOCUMENTS

| | | |
|---|---|---|
| EP | 1 313 308 | 5/2003 |
| WO | WO 01/23909 | 4/2001 |

OTHER PUBLICATIONS

S. Belleti et al. "A Pixel Ionization Chamber As Monitor For Therapeutical Hadron Beams" Abstract, Phisica Media, vol. XVII, Supplement 3, 2001, p. 61.

* cited by examiner

*Primary Examiner*—Que T Le
(74) *Attorney, Agent, or Firm*—MacPherson Kwok Chen & Heid LLP; Michael Shenker

(57) ABSTRACT

A light-to-frequency converter includes a switch (130) connected in series with a reverse-biased photodiode (120). A node (150) in the current path through the switch and the photodiode is connected to the input of a Schmidt trigger (160), whose output controls the switch. New techniques are provided for motion compensation, partial readouts, dark current elimination, non-destructive testing, and sensing the state of a memory cell.

10 Claims, 4 Drawing Sheets

US 7,476,840 B2

SENSING LIGHT AND SENSING THE STATE OF A MEMORY CELL AN AID OF A SWITCH CONTROLLED BY A SCHMIDT TRIGGER

CROSS REFERENCE TO RELATED APPLICATIONS

The present application claims priority of U.S. provisional application No. 60/809,703, filed May 30, 2006, and U.S. provisional application No. 60/798,860, filed May 8, 2006, both of which are incorporated herein by reference.

BACKGROUND OF THE INVENTION

The present invention relates to sensing light and sensing the state of a memory cell. Some embodiments relate to current-to-frequency converters including, but not limited to, light-to-frequency converters (LTF converters).

A typical light-to-frequency converter includes a photodiode that produces an electrical current proportional to the amount of light (the number of photons) detected by the photodiode per unit of time. The LTF converter converts the photodiode current to a sequence of electrical pulses of a frequency proportional to the current's magnitude. The pulses can be counted to provide a digital value corresponding to the amount of light per unit of time. See e.g. U.S. Pat. No. 4,465,562, issued Aug. 28, 1984 to Wicnienski et al. and incorporated herein by reference.

SUMMARY

This section summarizes some features of the invention. Other features are described in the subsequent sections. The invention is defined by the appended claims which are incorporated into this section by reference.

Some embodiments of the present invention include light-to-frequency converters implemented with simple circuitry. In some embodiments, for example, an LTF converter includes a switch connected in series with a reverse-biased photodiode. A node between the photodiode and the switch is connected to the input of a Schmidt trigger, whose output controls the switch. When the switch is closed, the Schmidt trigger's input voltage increases. When this voltage reaches the Schmidt trigger's high trigger voltage, the switch is opened, and the voltage on the Schmidt trigger's input is discharged through the photodiode at the rate determined by the amount of light detected by the photodiode. When the Schmidt trigger's input reaches the low trigger voltage, the switch is closed, and the Schmidt trigger input voltage increases again. This cycle repeats to produce pulses at the Schmidt trigger's output of a frequency which depends on the amount of light detected by the photodiode.

Some embodiments of the present invention provide novel uses for light-to-frequency converters and other types of photodetector circuits including prior art converters and converters of the present invention. For example, novel techniques are provided to reduce motion blur when taking an image of a moving scene. Some features take advantage of the light-to-frequency converters' ability to easily combine different images. Some embodiments provide circuits for sensing the state of a memory cell.

The invention is not limited to the features and advantages described above. Other features are described below. The invention is defined by the appended claims.

DESCRIPTION OF SOME EMBODIMENTS

The embodiments described in this section illustrate but do not limit the invention. The invention is defined by the appended claims.

Light-to-Frequency Converters

Figure 1:
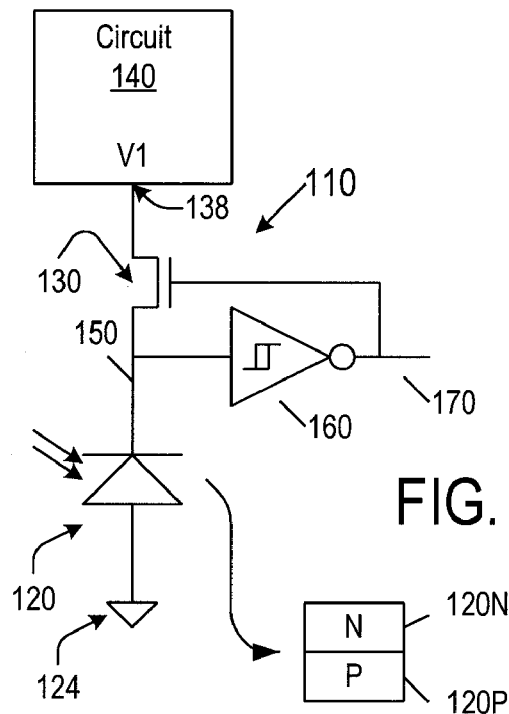
FIG. 1 is a circuit diagram of a light-to-frequency converter according to some embodiments of the present invention.

FIG. 1 is a circuit diagram of a light-to-frequency converter 110 according to some embodiments of the present invention. A photodiode 120 has its anode 120P connected to a reference voltage terminal 124 (e.g. ground) and cathode 120N connected to a switch 130. (The anode is P type semiconductor material, and the cathode is N type semiconductor material.) In this embodiment, the switch is an NMOS transistor whose source is connected to the photodiode's cathode 120N. The drain of transistor 130 is connected to an output 138 of a circuit 140 to receive a voltage V1 (e.g. a power supply voltage VCC) which is positive relative to the voltage on terminal 124. Circuit 140 can be a voltage source for example.

Node 150 at the cathode of photodiode 120 and the source of transistor 130 is connected to the input of a Schmidt trigger (Schmidt inverter) 160 whose output 170 is the output of converter 110. Output 170 is connected to the gate of transistor 130. Output 170 can also be connected to a counter (not shown in FIG. 1) to count the pulses generated by the Schmidt trigger.

In operation, when transistor 130 is on, the photodiode is reverse biased. The photodiode's intrinsic capacitance is charged up, and the voltage V150 (FIG. 2) at node 150 increases to reach a voltage level VtrH which is the high trigger voltage of Schmidt trigger 160. At this time (time t1), the Schmidt trigger's output 170 (voltage V170 in FIG. 2) becomes low to turn off the transistor 130. Node 150 is discharged through photodiode 120 at the rate proportional to the light detected by the photodiode. (The term "proportional" as used herein is broader than "directly proportional"; thus, the photodiode discharge rate increases with amount of light detected by the photodiode, but may or may not be linearly dependent on the amount of light). At a time t2, the voltage V150 on node 150 hits the low trigger voltage VtrL of Schmidt trigger 160. Node 170 becomes high to close the switch 130. Node 150 charges up, and reaches the high trigger voltage VtrH. Node 170 is again driven low, thus completing the first pulse 210. The process of the time interval t1~t3 is repeated as long as desired.

The rate of the voltage change on node 150 depends on the RC delay which is a function of the intrinsic capacitance of the pn junction of photodiode 120 and of the resistances and capacitances of the photodiode's cathode 120N and transistor 130. If desired, an additional capacitor can be connected between node 150 and another terminal, e.g. terminal 124, and/or an additional resistor can be added in series with transistor 130 and photodiode 150, to control the RC delays affecting the node 150 voltage.

Figure 2:
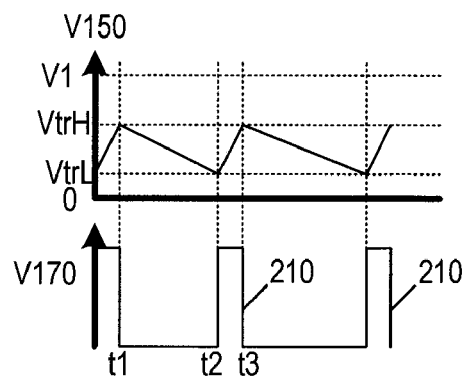
FIG. 2 is a timing diagram for a light-to-frequency converter according to some embodiments of the present invention.

While FIG. 2 pictures the voltage V150 as a linear function of time, a non-linear profile can be obtained. The difference VtrH−VtrL can be adjusted as needed, to provide a desired resolution for example (since the number of pulses increases when this difference is decreased). Values below 10% of VCC are used in some embodiments in which the Schmidt trigger is powered by VCC and ground. In other embodiments, VtrH−VtrL can be 50% of VCC, or can exceed 90% of VCC. This value can be adjusted for each exposure in the converter in some embodiments.

The invention is not limited to a particular type of switch 130. For example, in FIG. 3, the switch is a PMOS transistor. Its gate is connected to the output of inverter 310 whose input is connected to the Schmidt trigger's output 170. (Output 170 may or may not be the output of converter 110; the converter's output can be the output of inverter 310 or of some other circuitry whose input is connected to node 170.) Switch 130 can be connected between photodiode 120 and terminal 170.

Figure 3:
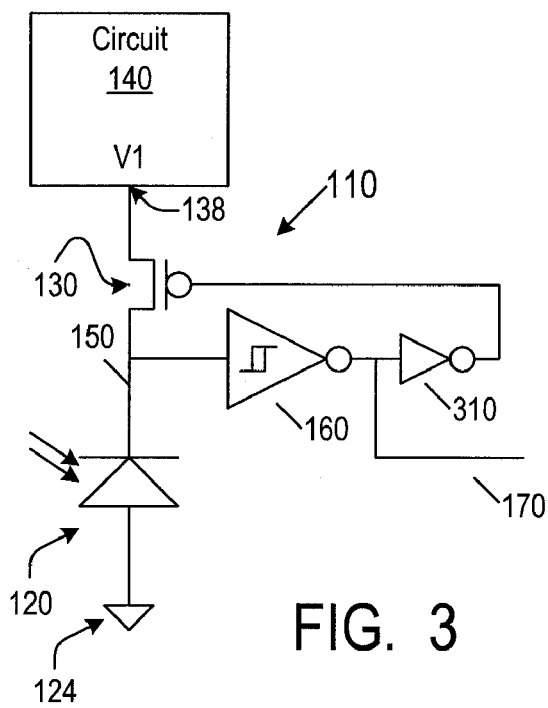
FIGS. 3, 4 are circuit diagrams of light-to-frequency converters according to some embodiments of the present invention.
Figure 4:
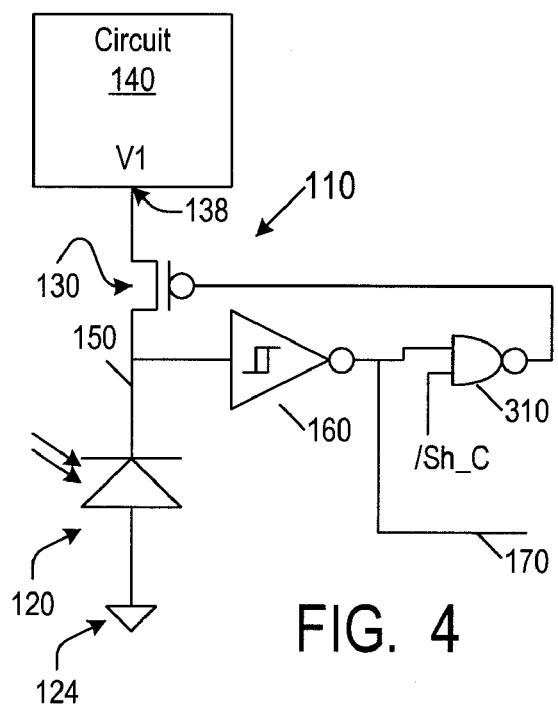

LTF converter 110 may be provided with an electronic shutter. See FIG. 4. Some conventional imagers use mechanical shutters which, when closed, shield photodetectors from light. In an X-ray application, a mechanical shutter can be absent, and the X-ray source may be turned on and off to act like a shutter. Some digital cameras use electronic shutters to control the time when the light detected by the photodetectors is recorded by the camera. See e.g. U.S. patent publication no. 2004/0002644 A1 (inventors Seim et al.) published Jan. 1, 2004, incorporated herein by reference. The converter of FIG. 4 is identical to the converter of FIG. 3 except that the inverter 310 of FIG. 3 is replaced with NAND gate 310 whose inputs are the output 170 of Schmidt trigger 160 and a shutter-closed signal /Sh_C. When /Sh_C is low, the output of NAND gate 310 is high, and PMOS transistor 130 is off. Node 150 may discharge if there is enough light detected by photodiode 120, but node 150 is not charged up, and therefore no pulses are generated on output 170. When /Sh_C is high, NAND gate 310 acts as an inverter to provide the same operation as in FIG. 3.

In some embodiments, NAND gate 310 is replaced with an AND gate to keep node 150 high when the shutter input is low. The invention is not limited to any specific electronic shutter logic. A shutters can also be provided for the converter of FIG. 1.

The electronic shutters can be used to provide different shutter operations, possibly closing the shutters of some pixels (some converters 110) while opening the other pixels' shutters. For example, a rolling shutter can be implemented.

The invention is not limited to embodiments described hereinabove. Some embodiments include a method for light-to-frequency conversion, the method comprising: (1) controlling a Schmidt trigger's input with a voltage on a node (e.g. node 150) located in a current path comprising a switch (e.g. 130) and a photodiode that are connected in series, with the photodiode being reverse biased at least when the switch is closed; and (2) during operation (1), controlling the switch with the Schmidt trigger's output to alternately open and close the switch. The current path can be the path from terminal 138 to terminal 124 for example. The current paths in FIGS. 1, 3, 4 do not have capacitors in them, and thus each current path conducts charge carriers all the way from terminal 138 to terminal 124. Other embodiments include capacitors in the current path.

In some embodiments, the switch may be temporarily controllably disabled from being controlled by the Schmidt trigger's output. This can be done using the signal /Sh_C for example.

Some embodiments provide a light-to-frequency converter comprising: a current path comprising a photodiode and a switch connected in series with the photodiode, the current path being for conducting current through the photodiode and the switch at least when the photodiode is reverse biased and detects light; and a Schmidt trigger having an input whose voltage is for being controlled by a voltage on a node located in the current path, the Schmidt trigger having an output whose voltage is for controlling the switch. In some embodiments (e.g. in FIGS. 1, 3, 4), the switch is connected to the photodiode's cathode, but this is not necessary. For example, the switch and the photodiode can be interchanged. In some embodiments, the node is at the photodiode's cathode, but this is not necessary.

Generation of Electrical Pulses Indicative of State of a Memory Cell

Figure 5:
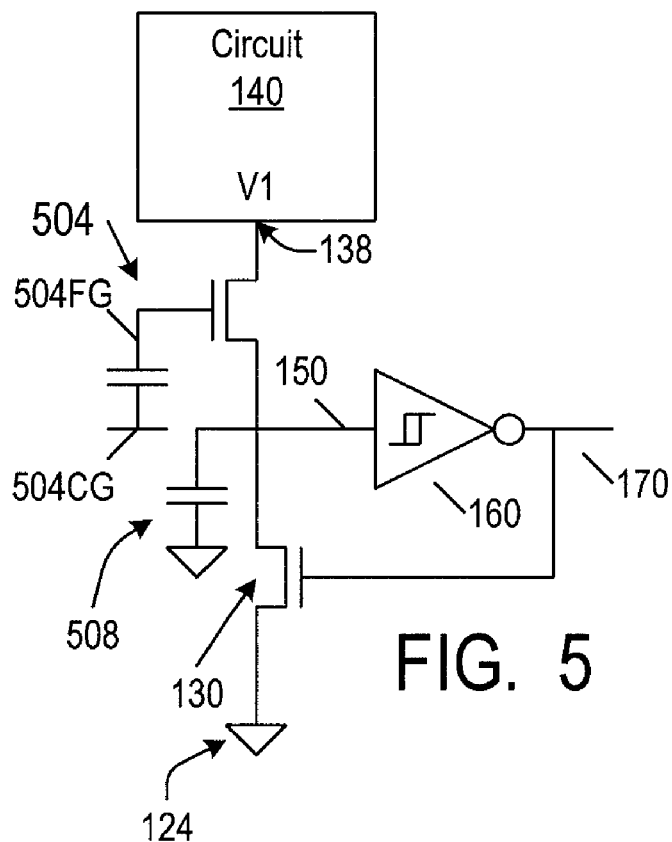
FIGS. 5, 6 are circuit diagrams of current-to-frequency converters for sensing the state of a memory cell according to some embodiments of the present invention.

A current-to-frequency converter can be used to sense the state of a memory cell rather than light. In FIG. 5, memory cell 504 is a floating gate transistor connected between the output 138 of circuit 140 and the node 150 at the input of Schmidt trigger 160. The cell's control gate 504CG receives a reading voltage needed for cell reading. This may be ground or some other voltage, depending on the cell architecture. The current through the cell 504 is a function of the charge stored on the cell's floating gate 504FG. The drain of cell 504 is connected to output 138 of circuit 140 (possibly a voltage source), and the source is connected to node 150 at the input of Schmidt trigger 160. Switch 130 is connected between the node 150 and terminal 124 (which may or may not be a ground terminal). Switch 130 is an NMOS transistor whose gate is connected to output 170 of Schmidt trigger 160. (Other types of switches can also be used as discussed above in connection with FIGS. 1-4.) A capacitor 508 is connected to node 150, for example between the node 150 and a ground terminal such as 124, to adjust the RC delay at node 150. A resistor can be provided in series with cell 504 and switch 130 (e.g. between the node 150 and switch 130) if desired.

The circuit operates in a manner similar to the current to frequency converters of FIGS. 1, 3, 4. The floating gate voltage (which is a function of the charge stored on the floating gate and of the voltage between the control gate and some other part of the cell) is converted to the current flowing through cell 504 from terminal 138 to node 150. The electrical pulses on output 170 can be counted with a counter (not shown) for a predefined duration of time. The counter thus provides the state of the memory cell. In some embodiments, if control gate 504CG is grounded or at some other predefined voltage, no current flows through the cell regardless of the charge on floating gate 504FG. Therefore, the counting duration can be controlled by controlling the voltage on control gate 504CG (and/or on the cell's select gate if the cell has a select gate) to enable the cell to conduct current only during the read operation. Alternatively, a shutter-like circuitry can be used as described above in connection with FIG. 4.

In some embodiments, cell 504 is a charge trapping cell, with floating gate 504FG replaced by a charge trapping layer (e.g. silicon nitride). The invention is not limited to a particular memory cell type. In some embodiments, cell 504 is a multilevel cell.

Figure 6:
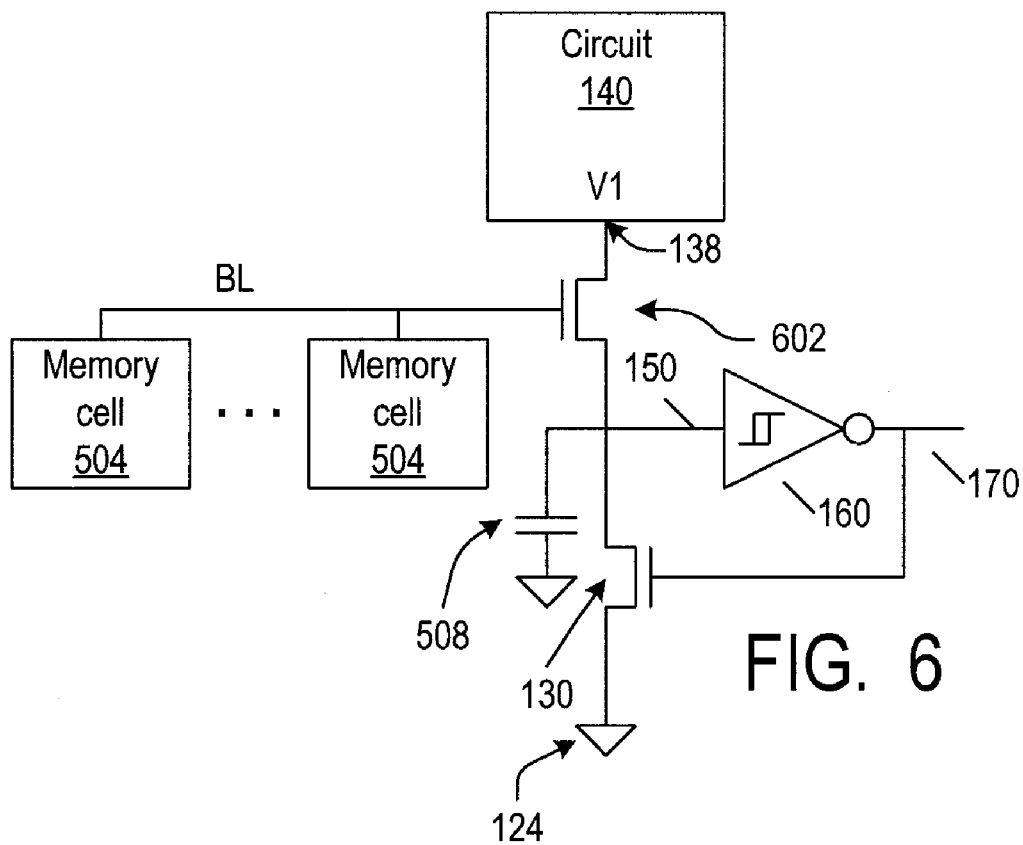

In some embodiments, multiple memory cells share one or more of the circuits 160, 130, 140. Thus in FIG. 6, multiple memory cells 504 are connected to a bitline BL which in turn is connected to the gate of NMOS transistor 602 whose source is connected to node 150 and whose drain is connected to output 138 of circuit 140. FIG. 6 is otherwise identical to FIG. 5. Any one of cells 504 can be connected to the bitline BL at any given time. The output pulses on node 170 can be counted by a counter (not shown) to provide the cell's state. Cells 504 can be volatile or nonvolatile memory.

Some embodiments of FIGS. 5, 6 are believed to be highly suitable for multilevel cells because the pulse count can provide precise differentiation between memory states without requiring highly precise circuitry.

The invention is not limited to the embodiments described above. Some embodiments provide a method for generating electrical pulses indicative of a state of a memory cell, the method comprising: controlling a conductivity of a first portion of a current path (e.g. the portion from terminal 138 to node 150) to cause the conductivity to reflect the state of the memory cell, the current path comprising a switch (e.g. 130) connected in series with the first portion; and alternately opening and closing the switch in response to a control signal (e.g. the signal on the Schmidt trigger's output 170); wherein the control signal is generated from an output of a Schmidt trigger whose input is controlled by a voltage on a node (e.g. 150) located in the current path.

In some embodiments (like in FIGS. 5, 6), the switch is connected downstream from the first portion in the current flow in the current path, but this is not necessary.

In some embodiments (e.g. in FIGS. 5, 6), the node is between the first portion of the current path and the switch, but this is not necessary.

Imagers

Figure 7:
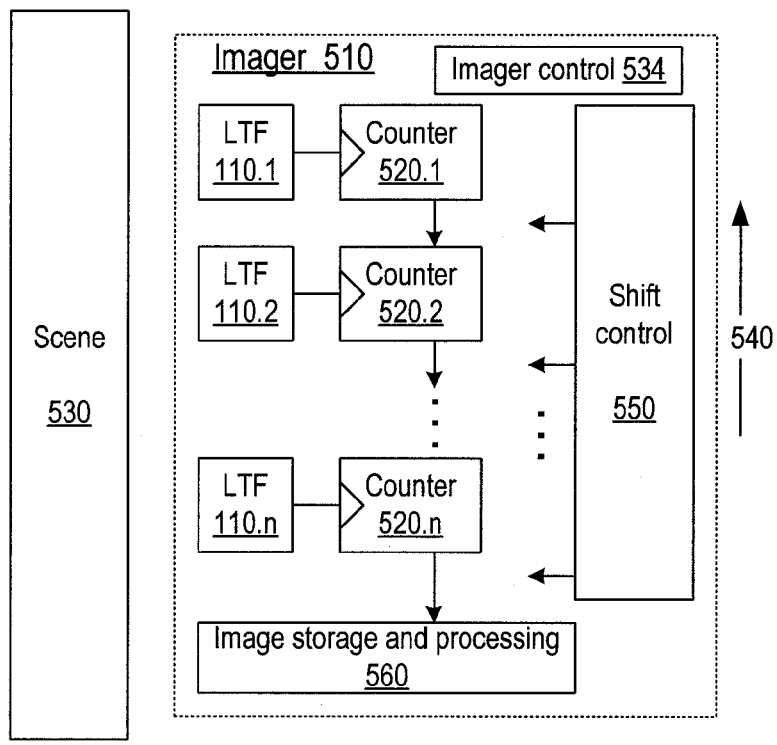
FIG. 7 is a block diagram of an imager acquiring an image according to some embodiments of the present invention.

Returning now to light-to-frequency conversion, FIG. 7 illustrates an imager 510 having a number of pixels (possibly a two dimensional array of pixels). Each pixel contains a light-to-frequency converter 110 and a counter 520. FIG. 7 illustrates a column of pixels. The converters are labeled 110.1 through 110.$n$, and the corresponding counters are labeled 520.1 through 520.$n$. The LTF converters 110.$i$ ($i=1, \ldots, n$) can be as described above in connection with FIGS. 1-4, or can be other types, including possibly prior art converters. The imager is controlled by a circuit 534 (e.g. a microprocessor). The imager is generating a digital image of a scene 530, which may consist of a single object or be arbitrarily complex. Imager 510 is moving relative to scene 530. The imager is moving upward in the view of FIG. 7 as indicated by arrow 540, but other types of motion are also possible. If the exposure time is long, the image collected by the imager could be blurred. In convention CCD imagers (Charge Couple Device imagers), blurring was reduced using "forward motion compensation". See European patent application EP 1 313 308 A2 published 21 May 2003 and incorporated herein by reference. In CCD imagers, each pixel stores a charge corresponding to the amount of light detected by the pixel per unit of time. As the imager moves up for example (as in FIG. 7), the charges in each column of pixels are shifted down. Thus, the charge recorded by a CCD pixel from a portion of scene 530 is shifted to the next CCD pixel, and the next CCD pixel adds on to that charge by detecting more light from the same portion of scene 530. Ultimately the charges are shifted out of the pixel array and digitized to generate a digital image.

Unlike the CCD imagers, the imager of FIG. 7 shifts the digital contents of counters 520 rather than analogue charges. The shifting occurs under the control of the imager's circuit 550. Such control circuits are well known. The last counter 520.$n$ in the column has its contents shifted out to a circuit 560 which stores the image and possibly performs some image processing. One advantage of this scheme is a large error margin because the storage and shifting of contents of the digital counters is easy to perform with less error than the storage and shifting of analogue charges.

Figure 8:
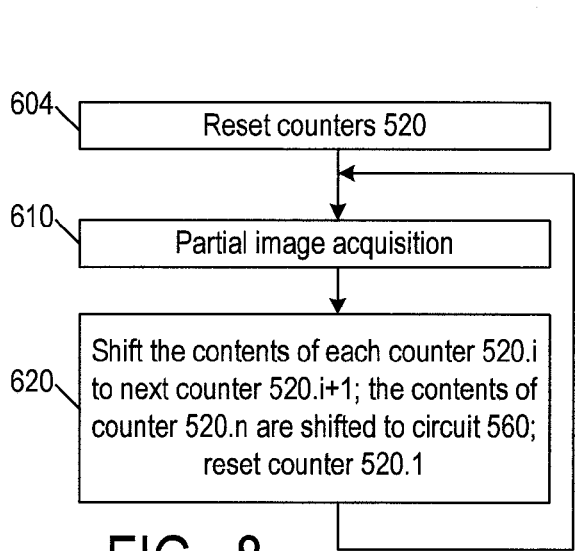
FIGS. 8-10 a flowcharts of imager operations according to some embodiments of the present invention.

The imager operation is shown in FIG. 8. The counters 520 are reset at step 604. Then image acquisition occurs at the pixels at step 610 to store image data in counters 520. At step 620, the contents of each counter 520.$i$ are shifted to counter 520.$i$+1, except for counter 520.$n$ whose contents are shifted out to circuit 560. Counter 520.1 can be reset at this step. Steps 610, 620 can be repeated as long as desired.

If shutters are used, they can be open for the duration of step 610, then closed for the duration of step 620. In some applications, the imager is moved (in direction 540) by a stepper motor (not shown) at step 620, but the imager does not move during the step 610 to improve the image clarity. Such operation is appropriate for medical X-ray systems, scanning of semiconductor wafers for defects, and other applications. In other applications, the imager may move continuously (if installed on an aircraft in a reconnaissance system, for example). In some embodiments, the imager does not move, but the scene 530 moves in the direction opposite to 540. The arrow 540 represents relative motion of the imager versus the scene and not necessarily absolute motion. Also, the scene 530 and/or the imager 510 may undergo other motion in addition to the motion 540. For example, motion 540 may be the imager motion relative to scene 530, and in addition the scene 530 may include a rotating wheel or other moving objects.

Step 620 may involve shifting only one or more, but less than all, of the bits of each counter 520.$i$ ($i<n$) to the next counter. For example, the least significant bit may be omitted to divide or multiply the counter's contents by 2 (this corresponds to the counter 520.$i$ value being shifted right or left by one bit when the value is shifted to counter 520.$i$+1). Counter 520.$i$+1, then integrates additional light at the next iteration of step 610, and the resulting value is again divided or multiplied by 2 when shifted to counter 520.$i$+2, and so on. This corresponds to varying the pixel sensitivity such that each pixel i (containing the LTF converter 110.$i$ and the counter 520.$i$) has a lower or greater sensitivity than pixel i+1. Thus, non-linear integration of light can be provided. Also, different iterations of step 620 may have different durations.

Figure 9:
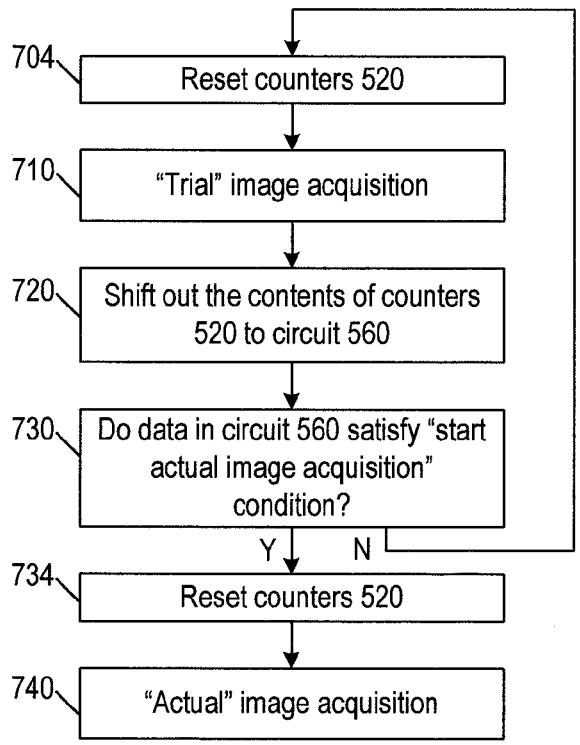

Imager 510 can be used with partial readouts to determine if the conditions are right to start image acquisition, e.g. to determine if the lighting level is sufficient or some other condition has been satisfied. Partial readouts can be performed regardless of whether or not the scene 530 is moving relative to the imager. An exemplary process is illustrated in FIG. 9. At step 704, the counters 520 are reset, and a "trial" image acquisition is performed at step 710. The "trial" image acquisition is performed simply to determine if conditions are right to start actual image acquisition. For example, the trial image acquisition can be performed for a shorter time than the actual image acquisition, and/or with some particular settings for the diaphragm and exposure time that are different from the settings for the actual image acquisition. Then the data from counters 520 are shifted out to circuit 560 (step 720), with the counters 520.1~520.n being used as a shift register (i.e. each counter's contents are shifted to the next counter, and the contents of counter 520.n are shifted to circuit 560). If the image was moving relative to the scene as in FIG. 7, and the method of FIG. 8 was used for the trial image acquisition, then some of the counters' data may have been shifted to circuit 560 at step 710 (note step 620). At any rate, the data shifted out of the counters are examined at step 730 to determine if the condition has been satisfied to start the actual image acquisition. (One possible condition is that at least one of counters 520 contain some minimal value, and other conditions are possible.) If not, the procedure returns to step 704 for the next trial. (In other embodiments, the data are shifted back into the counters, and the procedure returns to step 710; for example, in some embodiments, when the data are shifted from each counter to the next, the contents of counter 520.n are shifted to counter 520.1, so that at the end of step 720 the counters have the same data as at the end of step 710.) If the "start actual image acquisition" condition is satisfied, the counters are reset (step 734), and the actual image acquisition is performed (step 740). Step 734 can be omitted.

The invention is not limited to using the counters as a shift register to read or load the counters. The data can be read or loaded in parallel or in some sequence other than described above. Imager 510 may have multiple pixel columns, and each column can be operated on in parallel in the same manner.

Figure 10:
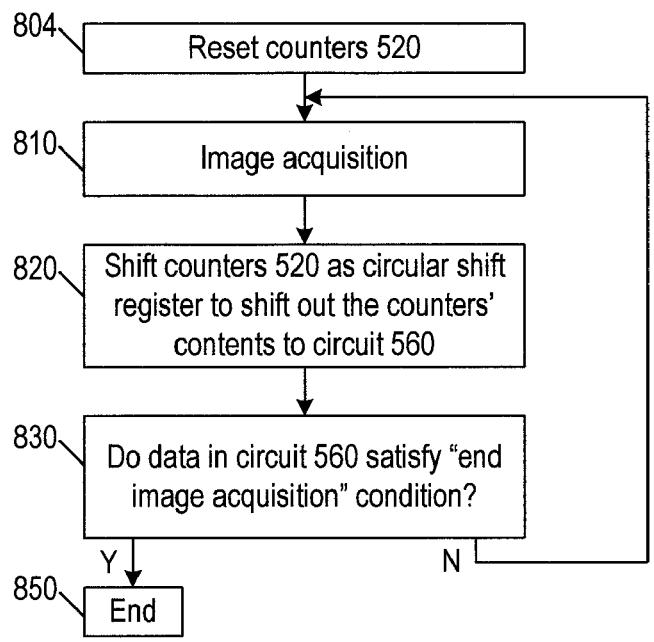

FIG. 10 illustrates a method suitable for long, uncertain exposure times, e.g. for taking a digital picture of a night sky. At step 804, counters 520 are reset. At step 810, image acquisition is performed for some time. At step 820, the counters' contents representing all or a desired part of the image are read out to circuit 560. The counter reading operation can be performed using any of the methods described above in connection with FIG. 9. In some embodiments, the counters' contents are unchanged (as in the case of a circular shift, when the counters in each column are used as a shift register, and the contents of counter 520.n are shifted into counter 520.1 in each column as described above). At step 830, the data in circuit 560 are tested to determine if the image acquisition should be stopped. One possible condition is that at least one of counters 520 has been filled, i.e. contains a maximum value, and other conditions are possible. If the image acquisition should continue (i.e. the data in circuit 560 do not satisfy the "end image acquisition" condition), the procedure returns to step 810. Thus, the next iteration of step 810 continues image acquisition starting with the partial image acquired in the previous iterations. If the condition of step 830 has been satisfied, the image acquisition ends (step 850).

In some embodiments, instead of resetting the counters at step 604, 704 and/or 734, or 804, the counters are preloaded with some image ("first image"). Then a second image is acquired as described above. The resulting counter values represent a composition (a sum) of the first and second images. The first image may be obtained by the same imager in an earlier operation or may be generated in some other manner.

In some embodiments, the counters are preloaded at step 604, 704 and/or 734, or 804 with some data that needed to be added to the acquired image to perform some image processing operation (e.g. Fast Fourier Transform). The preloaded data may also incorporate some calibration data or other unwanted data that must be removed from the image. Such data may incorporate "dark current", i.e. the photodiodes' leakage current existing when no light impinges on them.

Figure 11:
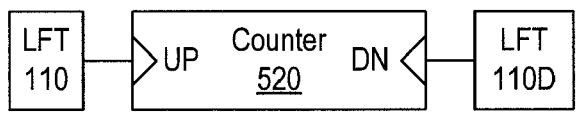
FIG. 11 is a block diagram of a light-to-frequency converter according to some embodiments of the present invention.

The dark current can also be subtracted using the scheme of FIG. 11. LFT converter 110D is identical to LFT converter 110 but is shielded from light. Therefore, the output pulses of converter 110D represent the dark current. Counter 520 has an UP input receiving pulses from converter 110 to count up on each pulse from converter 110, as in FIG. 7. In addition, counter 520 has a DN (DOWN) input receiving pulses from converter 110D, to count down on each pulse from converter 110D. In some embodiments, the converter 110D receives the same control signals (e.g. the shutter signal /Sh_C of FIG. 4) as converter 110 to ensure that the converter 110D generates output pulses under the same conditions as converter 110 (e.g. only when converter 110 is enabled to generate pulses). In some embodiments, a single converter 110D is provided for a row, a column, or a whole array of converters 110 and their associated counters 520.

In some embodiments, LFT 110D is omitted. Each counter's DN input receives count-down pulses configured to simulate the dark current. The count-down pulses are provided to each counter 520 when the corresponding converter 110 is enabled.

Figure 12:
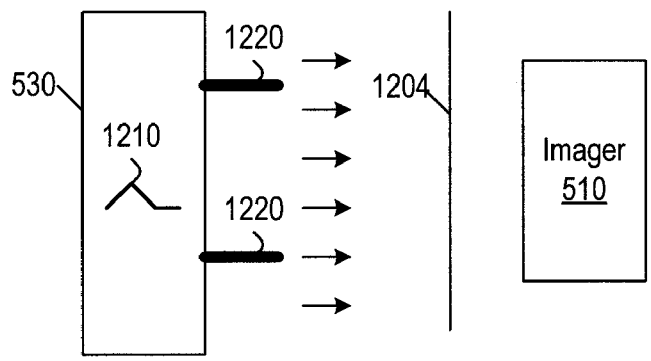
FIG. 12 is a block diagram illustrating an imager operation according to some embodiments of the present invention.
Figure 13:
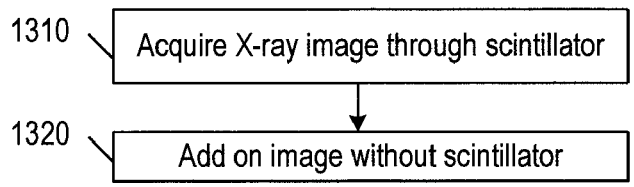
FIG. 13 is a flowchart of an imager operation according to some embodiments of the present invention.

FIGS. 12, 13 illustrate another application making use of the LTF converter's ability to easily combine different images. The scheme of FIGS. 12-13 can be used for non-destructive testing. An object 530 (e.g. a metal pipe) is tested for internal cracks 1210 using X-rays. Imager 510 can be as in FIG. 7. The imager's photodiodes 110 are not sensitive to X rays but are sensitive to visible light. A scintillator 1204 is placed between object 530 and imager 510 to convert the X-rays to visible light. At step 1310 (FIG. 13), a picture is taken with the imager, so the imager's counters 520 (FIG. 7) obtain counts corresponding to the X-ray image of object 530. The image may or may not contain externally visible features 1220. Therefore, it may be difficult to determine from the image the exact location of cracks 1210 relative to the visible features. It is therefore desirable to add the features 1220 to the image. This is done by removing the scintillator 1204 and then taking another picture of object 530 by the imager 510 (step 1320), with the object and the imager being in the same position as in step 1310. The counters are not reset, to add the image taken at step 1320 to the X-ray image taken at step 1310. The resulting image will contain both the cracks 1210 and the visible features 1220.

Step 1320 can be performed before step 1310 if desired.

The converters 110 described above in connection with FIGS. 7-12 can be the same as described above in connection with FIGS. 1-4 or can be other types of converters, including prior art converters.

The invention is not limited to the embodiments described above. For example, photodiode 120 (FIGS. 1-4) can be part of a phototransistor. The invention is not limited to a particular Schmidt trigger circuit. Any Schmidt triggers described in U.S. Pat. No. 4,468,562 issued Aug. 28, 1984 to Wicnienski et al. and U.S. Pat. No. 6,084,456 issued Jul. 4, 2000 to Seol (both incorporated herein by reference) are believed to be suitable, but other Schmidt triggers may also be appropriate. Some embodiments of the invention include CT scanners, airport security systems and other security systems, and/or other imaging systems.

Some embodiments include a method for obtaining a digital image of a scene with an imager comprising a plurality of pixels, each pixel comprising a photodetector (e.g. 110) and a digital storage device (e.g. counter 520) for incorporating data indicative of light detected by the photodetector, the plurality of pixels comprising at least a pixel PX1 and a pixel PX2 (e.g. the pixels with LTF converters 110.1, 110.2 in FIG. 7), the method comprising: (1) for each pixel of one or more of the pixels including at least the pixel PX1, performing the following operations (a), (b): (a) sensing light by the pixel; and (b) incorporating information on the light sensed by the pixel into the pixel's digital storage device (see step 610 for example); (2) after operation (1), incorporating information stored in the digital storage device of the pixel PX1 into the digital storage device of the pixel PX2 (for example, at step 620, the contents of counter 520.1 are incorporated into the counter 520.2); (3) when the imager has moved relative to the scene after a start of the operation (1) (for example after the start of step 610), performing the operations (a), (b) for the pixel PX2 (e.g. performing the next iteration of 610 for converter 110.2) to incorporate into the pixel PX2's digital storage device (e.g. into counter 520.2) the information on the light detected in the operation (1) by the pixel PX1 and the information on the light detected in the operation (3) by the pixel PX2 (for example, the counter 520.2 may have the sum of the count generated by counter 520.1 in the first iteration of 610 and the count generated by counter 520.2 in the second iteration of 610).

In some embodiments, the plurality of pixels comprise a sequence of pixels PX.1, . . . PX.n with the respective photodetectors PH.1, PH.2, . . . , PH.n and the respective digital storage devices DS.1, . . . ,DS.n, wherein the pixels PX1, PX2 are consecutive pixels PX.j, PX.j+1 for some j<n. For example, the plurality of pixels can be a column or row of pixels (in this disclosure, the rows and columns are treated interchangeably).

The invention also provides a control circuit (e.g. 534) for causing an imager to perform the operations discussed above.

Some embodiments of the present invention provide an imager comprising: a plurality of pixels each of which comprises a photodetector and a digital storage device for incorporating data indicative of light detected by the photodetector; shift control circuitry (e.g. 550, alone or in combination with 534) for controlling the digital storage devices to form one or more shift registers (e.g. counters 520.1~520.n can form a shift register), at least one shift register having a plurality of cells (each counter 520.i is a shift register's cell, i.e. storage that can be shifted to the next cell (or out of the shift register if i=n) on a clock signal (not shown)). Each cell comprises one or more bits of a respective one of the digital storage devices (the cell may be formed by less than all of the counter's bits).

In some embodiments, the shift registers can be circular, e.g. the contents of counter 520.n (the last cell) can be shifted back into counter 520.1 (the first cell).

Some embodiments include a method for obtaining a digital image of a scene with an imager comprising a plurality of pixels, each pixel comprising a light-to-frequency converter and a counter for counting pulses generated by the light-to-frequency converter, the counters forming one or more shift registers for shifting data out of the counters, the method comprising: (1) sensing light from the scene by the pixels; (2) after operation (1), shifting data from the one or more shift registers and testing the data to determine if additional image acquisition of the scene is needed (e.g. steps 720-730, or 820-830); (3) if additional image acquisition of the scene is needed, then sensing light from the scene by the pixels (e.g. step 710 or 810).

In some embodiments, in the operation (3) the sensing starts with the counters containing the data that was present in the counters at the end of the operation (1) (e.g. if the counters are not reset at step 704).

Some embodiments include a method for obtaining image data with a light-to-frequency converter, the method comprising: the light-to-frequency converter generating first electrical pulses indicative of light sensed by the light-to-frequency converter; a counter counting in a first direction (up or down) on the first pulses counting in a second direction (down or up) on second pulses provided to the counter. See FIG. 11 for example. In some embodiments, the second pulses are generated by a light-to-frequency converter (e.g. 110D) that does not detect light.

Some embodiments include a method for obtaining a digital image of a scene with an imager comprising a plurality of pixels, each pixel comprising a light-to-frequency converter and a counter for counting pulses generated by the light-to-frequency converter, the method comprising: (1) loading at least one of the counters with data other than reset data; and then (2) acquiring a first image with the imager, with said at least one of the counters counting the pulses generated by the associated light-to-frequency converter starting with the data loaded in (1). For example, the data in (1) may correspond to a second image, so the first and second images become combined. In some embodiments, the light-to-frequency converters are sensitive to light in a first range of wavelengths (e.g. visible light in FIGS. 12-13) but not in a second range of wavelengths (e.g. X-rays); one of operations (1), (2) comprises acquiring an image of an object through a light converter (e.g. scintillator 1204) which converts the second range of wavelengths to the first range of wavelengths; and the other one of operations (1), (2) comprises acquiring an image of said object without light conversion from the second range to the first range. In some embodiments, the first data corresponds to calibration data.

The invention is not limited to the embodiments described above. Other embodiments and variations are within the scope of the invention, as defined by the appended claims.

The invention claimed is:

1. A method for light-to-frequency conversion, the method comprising:
   (1) controlling a Schmidt trigger's input with a voltage on a node located in a current path comprising a switch and a photodiode that are connected in series, with the photodiode being reverse biased at least when the switch is closed; and
   (2) during operation (1), controlling the switch with the Schmidt trigger's output to alternately open and close the switch.

2. The method of claim 1 further comprising temporarily controllably disabling the switch from being controlled by the Schmidt trigger's output.

3. A light-to-frequency converter comprising:
   a current path comprising a photodiode and a switch connected in series with the photodiode, the current path being for conducting current through the photodiode and the switch at least when the photodiode is reverse biased and detects light; and
   a Schmidt trigger having an input whose voltage is controlled by a voltage on a node located in the current path, the Schmidt trigger having an output whose voltage is for controlling the switch.

4. The light-to-frequency converter of claim 3 wherein the switch is connected to the photodiode's cathode.

5. The light-to-frequency converter of claim 3 wherein the node is at the photodiode's cathode.

6. The light-to-frequency converter of claim 3 further comprising a circuit connected between the Schmidt trigger's output and the switch, for controllably disabling the switch from being controlled by the Schmidt trigger's output voltage.

7. A method for generating electrical pulses indicative of a state of a memory cell, the method comprising:

controlling a conductivity of a first portion of a current path to cause the conductivity to reflect the state of the memory cell, the current path comprising a switch connected in series with the first portion; and alternately opening and closing the switch in response to a control signal;

wherein the control signal is generated from an output of a Schmidt trigger whose input is controlled by a voltage on a node located in the current path.

8. The method of claim 7 wherein the switch is connected downstream from the first portion in the current flow in the current path.

9. An apparatus for generating electrical pulses indicative of a state of a memory cell, the apparatus comprising:

(1) a current path comprising a first portion whose conductivity is controllable to reflect the state of the memory cell, the current path also comprising a switch connected in series with the first portion, the switch having a control terminal for opening and closing the switch; and (2) a Schmidt trigger having an input connected to a node in the current path and having an output for providing the electrical pulses, the electrical pulses being indicative of the current flowing through the first portion of the current path, the electrical pulses being for controlling the control terminal of the switch.

10. The apparatus of claim 9 wherein the node is between the first portion and the switch.

* * * * *